US012191053B2

(12) United States Patent
    Jordan

(10) Patent No.: US 12,191,053 B2
(45) Date of Patent: Jan. 7, 2025

(54) GROUND CABLE WITH VISUAL INDICATOR

(71) Applicant: Copperweld Bimetallics, LLC, Brentwood, TN (US)

(72) Inventor: Jeffrey Thomas Jordan, Franklin, TN (US)

(73) Assignee: Copperweld Bimetallics LLC, Brentwood, TN (US)

( * ) Notice: Subject to any disclaimer, the term of this patent is extended or adjusted under 35 U.S.C. 154(b) by 0 days.

(21) Appl. No.: 17/156,110

(22) Filed: Jan. 22, 2021

(65) Prior Publication Data

US 2021/0233677 A1    Jul. 29, 2021

Related U.S. Application Data

(60) Provisional application No. 62/965,059, filed on Jan. 23, 2020.

(51) Int. Cl.
    *H01B 5/08*    (2006.01)
    *G01R 31/52*   (2020.01)
    *H01B 5/00*    (2006.01)

(52) U.S. Cl.
    CPC ............. *H01B 5/002* (2013.01); *G01R 31/52* (2020.01); *H01B 5/08* (2013.01)

(58) Field of Classification Search
    CPC ..................................... H01B 5/08; H01B 7/36
    See application file for complete search history.

(56) References Cited

U.S. PATENT DOCUMENTS

| 4,453,159 A | 6/1984 | Huff et al. |
| 4,498,282 A | 2/1985 | Graetz |
| 5,834,942 A | 11/1998 | Deangelis |
| 6,443,016 B1 | 9/2002 | Sinelli |
| 8,450,612 B2 * | 5/2013 | McEllen ................ H01B 7/365 |
| | | 174/103 |
| 10,475,552 B2 * | 11/2019 | Izumida .................. C22C 38/04 |
| 2006/0106443 A1 * | 5/2006 | Michael ................. A61N 1/056 |
| | | 607/122 |
| 2009/0287426 A1 | 11/2009 | Kukowski |
| 2010/0200266 A1 | 8/2010 | McEllen et al. |

(Continued)

FOREIGN PATENT DOCUMENTS

| JP | 58206006 A | 2/1983 |
| JP | 58206007 A | 2/1983 |

(Continued)

OTHER PUBLICATIONS

International Search Report and Written Opinion for International application No. PCT/US21/14741.

(Continued)

*Primary Examiner* — Chau N Nguyen
(74) *Attorney, Agent, or Firm* — Ryan J. Letson; Ashley M. Robinson; Bradley Arant Boult Cummings LLP

(57) ABSTRACT

A ground cable may comprise a plurality of strands. Inner core strands of the cable may be surrounded by an adjacent outermost layer or wrap of outer wrap strands. The outer wrap of strands may comprise at least one indicator strand, which may comprise an indicator finish on a portion of its surface. A characteristic of the indicator finish may change when exposed to a current level that exceeds an electrical fault threshold.

20 Claims, 7 Drawing Sheets

(56) References Cited

U.S. PATENT DOCUMENTS

| | | | |
|---|---|---|---|
| 2010/0264206 A1 | 10/2010 | Holcombe et al. | |
| 2014/0048607 A1 | 2/2014 | Holcombe et al. | |
| 2015/0268430 A1* | 9/2015 | Bringuier | G02B 6/443 |
| | | | 385/113 |

FOREIGN PATENT DOCUMENTS

| | | |
|---|---|---|
| JP | 206006 A | 12/1983 |
| JP | 206007 A | 12/1983 |
| JP | 246711 A | 10/1989 |
| JP | 01246711 A | 10/1989 |

OTHER PUBLICATIONS

Walt Ogrodnik; Use of color-changing pigment to detect wire and cable hazards; Wire Journal International; Apr. 2008, pp. 150-155.
1st Examination Report, dated Nov. 8, 2023 for Saudi Arabia Patent Application No. 522433377.
Extended European search report for European Patent Application No. 21745179.8.
Office action dated Mar. 12, 2024 for Canada Patent Application No. 3,168,804, citing US2010/0264206A1 and U.S. Pat. No. 44,531,59A, both previously disclosed and considered by the Examiner.
Office action dated Apr. 30, 2024 for Saudi Arabia Patent Application No. 3522433377 and English translation of relevant portion thereof.

* cited by examiner

GROUND CABLE WITH VISUAL INDICATOR

CROSS-REFERENCE TO RELATED APPLICATIONS

This application claims the benefit of, and priority to, U.S. Provisional Application No. 62/965,059, filed Jan. 23, 2020 and entitled "Ground Cable with Visual Indicator," which is hereby incorporated by reference in its entirety.

FIELD OF THE INVENTION

The present disclosure relates generally to electrical ground fault conductors, and specifically, to a ground cable with visual indicator for use therewith.

BACKGROUND OF THE INVENTION

This invention relates to the management and containment of electrical energy experienced by a grounding conductor that is installed in close proximity to electric power lines for the protection of people, electrical circuits, and related electrical equipment.

Generation, transmission, and distribution networks for supplying electrical energy, called as high voltage power lines, are typically monitored on a section-by-section basis for electrical faults to the Earth, called ground faults or ground leakage faults. Ground faults include but are not limited to short-circuits, which are contained and stopped by means of what are termed protection devices installed in the power conductor circuits. In the event of a ground fault, the protection devices isolate the part of the energy supply network affected by the fault from the rest of the network by opening corresponding circuit breakers and thereby avoid exposure to people and equipment.

Electrical energy normally flows along power conductors, with a separate nearby circuit called a ground fault conductor, carrying no current. However, during a ground fault event, high current—typically measuring thousands of amps—finds a way to ground by the path of least resistance.

Ideally, the path of least resistance is the nearby ground fault conductor installed in close proximity. Ground fault conductors are a common element of electrical power systems and play an important role in power network management by directing fault current from the power system to ground.

Such protective devices are critical to proper functioning of the systems protecting power circuits. However, over time damage and deterioration can occur when the ground wire is exposed to high levels of current repeatedly or when it experiences a single high-current electrical fault. As a result, the ground wire may no longer function as designed to remove excess current from the system.

For example, high voltage power lines can be damaged by wind, accumulating ice, animal interaction, or falling trees. In such instances, installed protection devices interrupt the power source upon detection of the high magnitude ground fault currents. But in the absence of sufficient conductors, the fault will make a path into the Earth by means of arcing, which is a random and explosive event.

In order to protect the circuit in the event of an electrical fault, condition of power conductors must be monitored closely. Therefore, it is common in the art for electric utilities to place additional physical faulted-circuit-indicators at regular intervals along the power conductor to sense and identify potential damage to infrastructure and equipment.

However, there are problems in identifying damaged power conductors. One problem is that a simple indication of the fault location does not provide sufficient information for service personnel to determine which, if any, portions of the protective grounding system need replacement. Current devices do not indicate which conductors carried the fault energy, or if that energy was near a limit for the conductor such that the performance of the conductor may be compromised. In some instances, fault energy may have been so far above the conductor's capacity that the conductor was vaporized completely as a result of carrying the current.

Another problem in identifying damaged power conductors arises from the need for service personnel to physically inspect the power conductors for damage. This involves close inspection by service personnel. If a ground wire has been compromised, service personnel may be subjected to hazardous voltages when they are in close proximity with a faulted circuit. This places the service personnel at risk of severe injury or death, such as from step and touch potentials. Improved techniques for identifying the location and extent of damage to power conductors caused by electrical faults are generally desirable.

BRIEF DESCRIPTION OF THE DRAWINGS

The above and other features of the present disclosure, its nature and various advantages will be more apparent upon consideration of the following detailed description, taken in conjunction with the accompanying drawings. The use of the same reference numbers in different figures indicates similar or identical items or features. The drawings are not necessarily to scale.

DETAILED DESCRIPTION

A. Definitions

Figure 1:
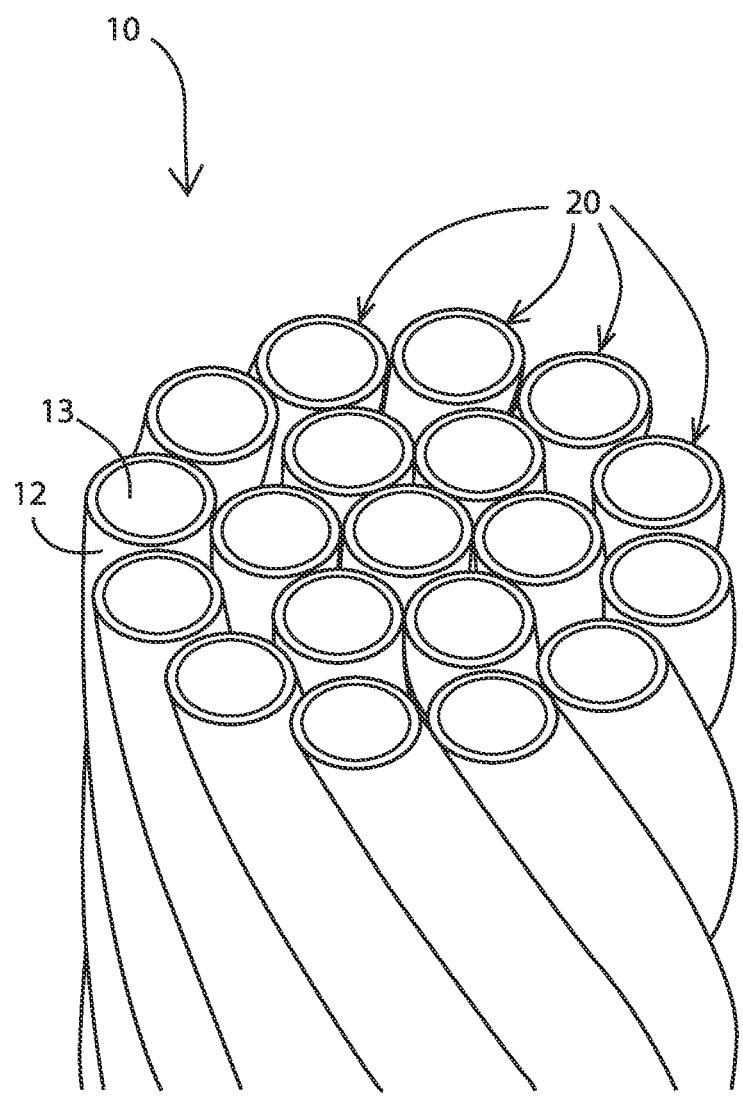
FIG. 1 shows a cross-sectional perspective view of a ground cable in accordance with some embodiments of the present disclosure.

Unless otherwise defined, all terms (including technical and scientific terms) used herein have the same meaning as commonly understood by one of ordinary skill in the art of this disclosure. It will be further understood that terms, such as those defined in commonly used dictionaries, should be interpreted as having a meaning that is consistent with their meaning in the context of the specification and should not be interpreted in an idealized or overly formal sense unless expressly so defined herein. Well known functions or constructions may not be described in detail for brevity or clarity.

The terms "about" and "approximately" shall generally mean an acceptable degree of error or variation for the quantity measured given the nature or precision of the measurements. Typical, exemplary degrees of error or variation are within 20 percent (%), preferably within 10%, and more preferably within 5% of a given value or range of values. Numerical quantities given in this description are approximate unless stated otherwise, meaning that the term "about" or "approximately" can be inferred when not expressly stated.

It will be understood that when a feature or element is referred to as being "on" another feature or element, it can be directly on the other feature or element or intervening features and/or elements may also be present. In contrast, when a feature or element is referred to as being "directly on" another feature or element, there are no intervening features or elements present. It will also be understood that, when a feature or element is referred to as being "connected", "attached" or "coupled" to another feature or element, it can be directly connected, attached or coupled to the other feature or element or intervening features or elements may be present. In contrast, when a feature or element is referred to as being "directly connected", "directly attached" or "directly coupled" to another feature or element, there are no intervening features or elements present. Although described or shown with respect to one embodiment, the features and elements so described or shown can apply to other embodiments.

The terminology used herein is for the purpose of describing particular embodiments only and is not intended to be limiting. As used herein, the singular forms "a", "an" and "the" are intended to include the plural forms as well, unless the context clearly indicates otherwise.

Spatially relative terms, such as "under", "below", "lower", "over", "upper" and the like, may be used herein for ease of description to describe one element or feature's relationship to another when the apparatus is right side up.

The terms "first", "second", and the like are used herein to describe various features or elements, but these features or elements should not be limited by these terms. These terms are only used to distinguish one feature or element from another feature or element. Thus, a first feature or element discussed below could be termed a second feature or element, and similarly, a second feature or element discussed below could be termed a first feature or element without departing from the teachings of the present disclosure.

Terms such as "at least one of A and B" should be understood to mean "only A, only B, or both A and B." The same construction should be applied to longer list (e.g., "at least one of A, B, and C").

The term "consisting essentially of" means that, in addition to the recited elements, what is claimed may also contain other elements (steps, structures, ingredients, components, etc.) that do not adversely affect the operability of what is claimed for its intended purpose as stated in this disclosure. Importantly, this term excludes such other elements that adversely affect the operability of what is claimed for its intended purpose as stated in this disclosure, even if such other elements might enhance the operability of what is claimed for some other purpose.

In some places reference is made to standard methods, such as but not limited to methods of measurement. It is to be understood that such standards are revised from time to time, and unless explicitly stated otherwise reference to such standard in this disclosure must be interpreted to refer to the most recent published standard as of the time of filing.

It is to be understood that any given elements of the disclosed embodiments of the invention may be embodied in a single structure, a single step, a single substance, or the like. Similarly, a given element of the disclosed embodiment may be embodied in multiple structures, steps, substances, or the like.

B. Ground Wire with Fault Indicator

A ground cable may comprise a plurality of strands. Inner core strands of the cable may be surrounded by an adjacent outermost layer or wrap of outer wrap strands. The outer wrap of strands may comprise at least one indicator strand, which may comprise an indicator finish on a portion of its surface. A characteristic of the indicator finish may change when exposed to a current level that exceeds an electrical fault threshold.

FIG. 1 shows a cross-sectional perspective view of a ground cable 10 in accordance with some embodiments of the present disclosure. The ground cable 10 comprises a plurality of wire strands that have been twisted together to form the ground cable 10. In some embodiments, the individual strands of wire comprise a core 13 enclosed within a sheath 12 that has been welded to the core 13. In some embodiments, the core 13 comprises at least steel, and sheath 12 comprises at least copper (e.g., CAS No. 7440-50-8), although other materials and combinations of these and other materials are possible in other embodiments.

The embodiment of the ground cable 10 shown in FIG. 1 is bimetallic and provides a highly durable ground connection by virtue of the exterior copper sheath 12 surrounding the steel core 13. A sheath 12 encloses approximately the full length of each wire strand in FIG. 1. This may allow for sufficient strength and improved resistance to fatigue and physical breakage compared with alternative solutions. In some embodiments, one or more wire strands may have a sheath that encloses a portion of the wire that is less than the full length of the one or more wire strands.

In some embodiments, physical characteristics of the sheath 12 may be changed in the event of a fault. For example, when a strand with a copper sheath 12 experiences a fault current of greater than approximately 90-95% of the fault rating for copper sheath 12 (e.g., approximately 41 kA for 0.5 seconds or other rating), some copper material may be lost, damaging the strand. If the fault current is high enough (at or above the rated amount for copper), an explosion may occur in which the wire is lost. Also, repeated high levels of current (e.g., cycling) can cause similar damage. The foregoing damage can compromise performance of the ground wire 10 as described above, presenting a significant risk to the safety of personnel and equipment.

Note that core 13 may be various diameters to achieve a desired diameter for the cable strands, such as to produce a wire with a desired gage (e.g., between #44 AWG to 0000 AWG or otherwise). Similarly, copper sheath 12 may be various thicknesses to achieve a desired diameter for one or more cable strands. In some embodiments, a bimetallic strand (e.g., core 13 with copper sheath 12) may vary in diameter between from approximately 0.05024 to 5.189 mm or otherwise. Other dimensions are possible in other embodiments.

Note also that one or more materials may be selected for use in one or both of core 13 and sheath 12, and that use of such materials in strands of the same ground cable 10 may vary within the ground cable 10 as desired. For example, a ground cable 10 may comprise one or more of a first core strand having a steel core 13 and copper sheath 12, a second strand comprising a core 13 made from a metal other than steel and a sheath 12 made from a metal other than copper, a third core strand comprising a steel core 13 without a sheath 12, and a fourth strand comprising a copper core 13 without a sheath 12. In some embodiments, the ground cable 10 may comprise various numbers and types of strands, each strand comprising other or various combinations of materials, and either including a sheath or not, as may be desired.

In the embodiment of FIG. 1, sheath 12 is bonded to core 13. The sheath 12 and core 13 may be bonded or coupled together using various techniques, but in some embodiments may be permanently bonded together, such as by welding or similar technique. In this regard, the permanent bonding (e.g., weld) may prevent corrosion or electrolysis between the copper sheath 12 and steel core 13, as had been problematic in conventional designs. In some embodiments, the copper sheath 12 may prevent or substantially reduce the likelihood that corrosion will occur between a surface of the grounding cable 10 and couplings to which the cable 10 is joined, such as bronze couplings (not specifically shown in FIG. 1). In this regard, the copper sheath 12 may prevent or substantially reduce undesirable increases in joint resistance between the cable 10 and couplings. As a further benefit of some embodiments of the present disclosure, the copper sheath 12 may enhance electrical conductivity of the cable 10, as may be desirable in a power conductor.

While the cable 10 and its components are described as comprising particular materials, it will be appreciated that the ground cable 10 also can comprise various other materials and combinations of various materials in some embodiments. For example, as noted herein, the ground cable 10 can include one or more single solid copper strands, one or more strands comprising other metals, alloys, or one or more bimetallic wire strands, or cables made of such strands of various sheath and finish thicknesses.

Figure 2A:
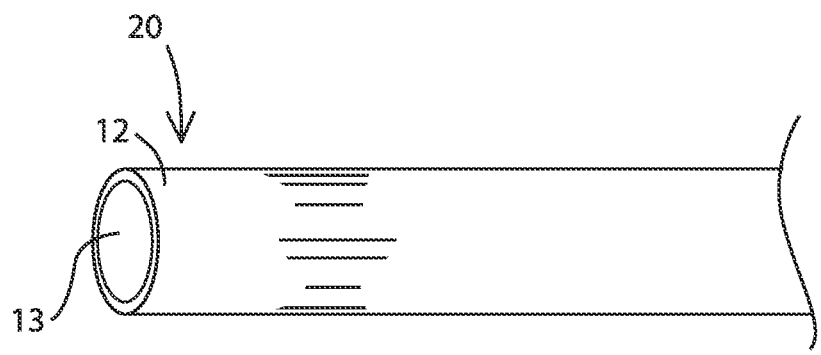
FIG. 2A shows a side view of a strand of a ground cable in accordance with some embodiments of the present disclosure.
Figure 2B:
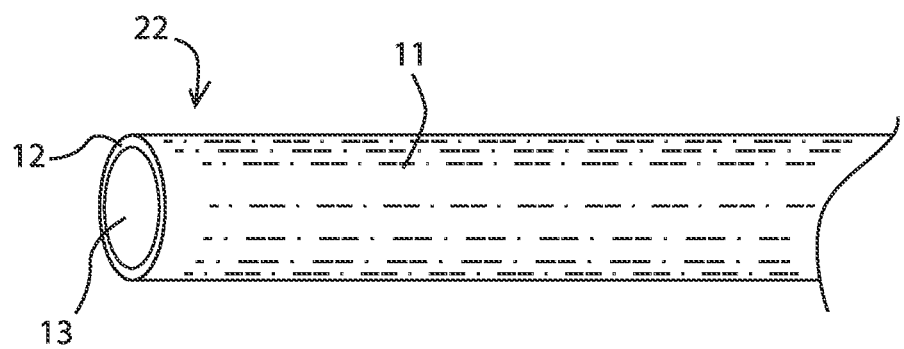
FIG. 2B shows a side view of a strand of a ground cable with an indicator finish in accordance with some embodiments of the present disclosure.

FIG. 2A shows a side view of a strand of a ground cable without an indicator finish, and FIG. 2B shows a side view of a strand of a ground cable with an indicator finish in accordance with some embodiments of the present disclosure. The strand 20 in FIG. 2A is similar to the strands of ground cable 10 shown in FIG. 1 and includes steel core 13 and copper sheath 12. The sheath 12 does not have any additional coating or treatment of the surface of copper sheath 12. In this regard, an outer surface of the copper sheath 12 may visibly appear as being comprised of copper (e.g., having the luster, color, and consistency of copper).

Figure 6:
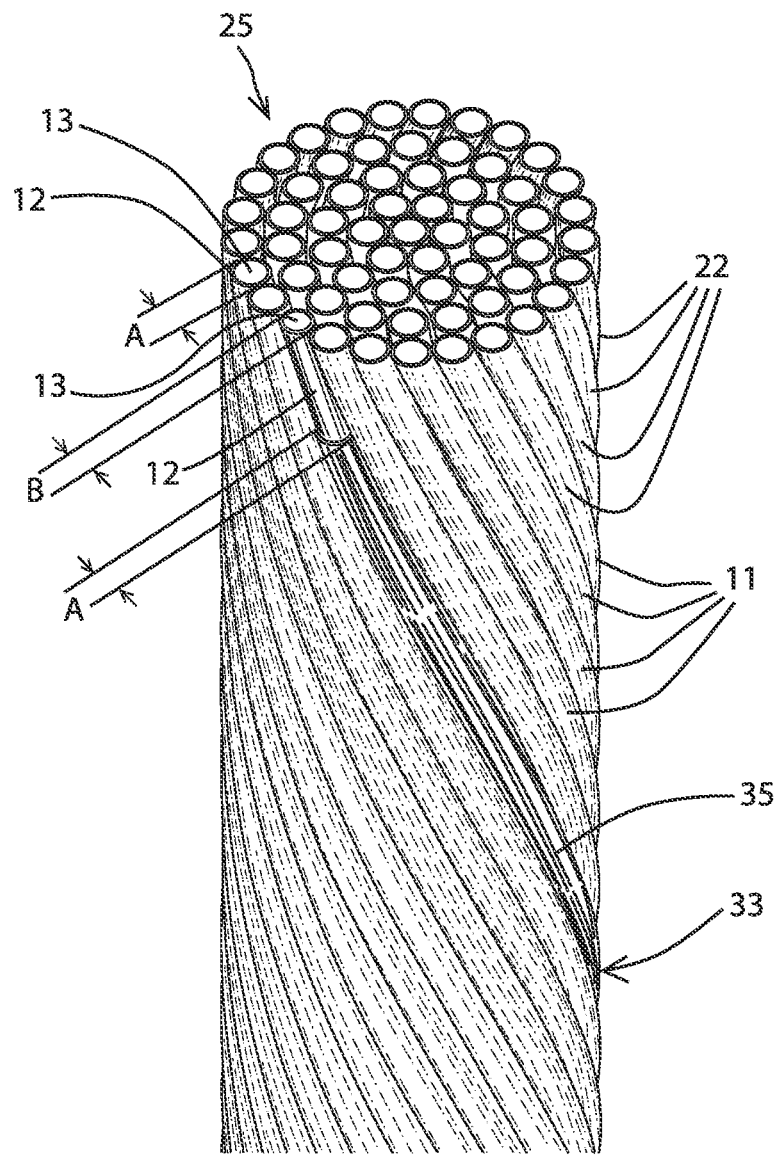
FIG. 6 shows view of a ground cable with a jacketed reference strand in accordance with some embodiments of the present disclosure.
Figure 7:
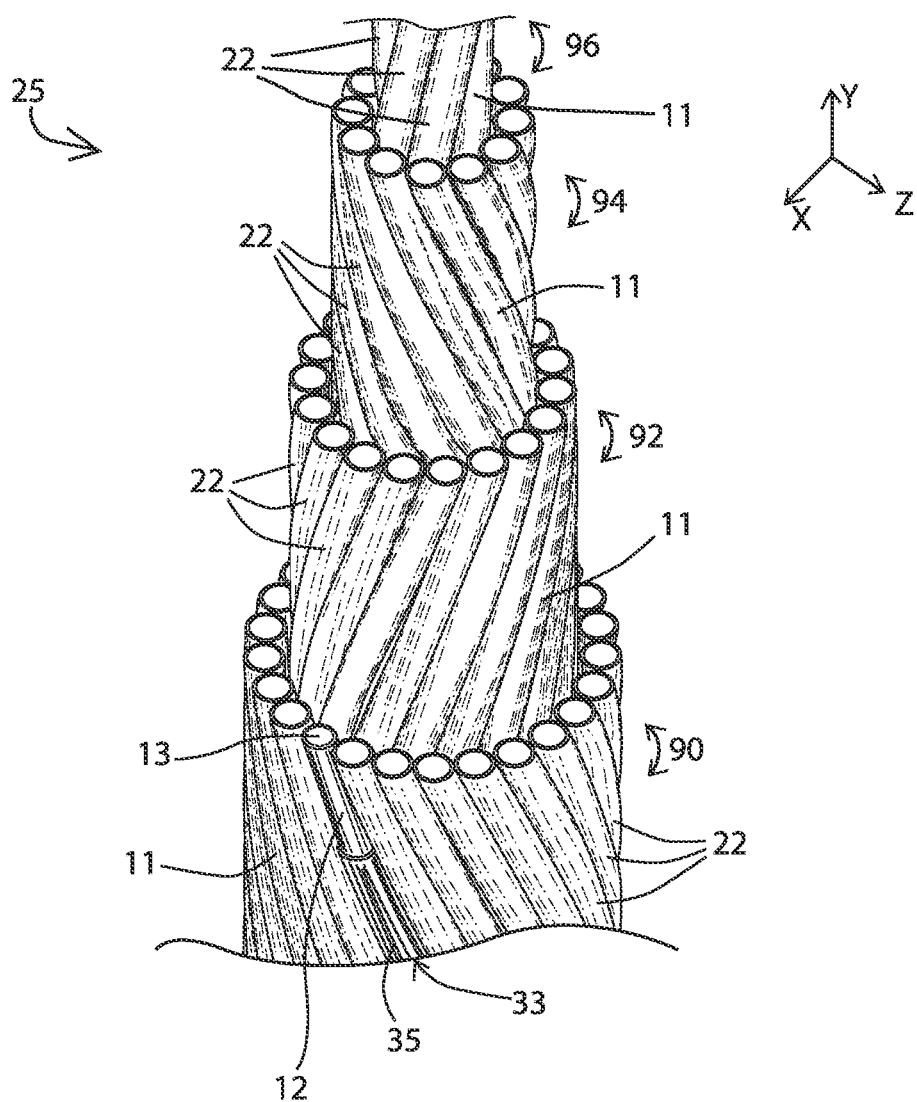
FIG. 7 shows an alternative telescoped view of a ground cable with a jacketed reference strand in accordance with some embodiments of the present disclosure.

A first set of finishing lines is shown on the surface of the strand 20 in FIG. 2A (e.g., surface of copper sheath 12) and indicates that the surface does not have an indicator finish 11. A second set of finishing lines is shown on the surface of strand 22 in FIG. 2B (e.g., surface of the indicator finish 11) and indicates that the surface has indicator finish 11. Such lines or similar lines may be shown in other figures, such as FIGS. 3, and 4, to indicate the presence or absence of indicator finish 11. In FIGS. 6 and 7, In general, finishing lines similar to those in FIG. 2B may indicate presence of an indicator finish 11, while lines similar to those in FIG. 2A or absence of finishing lines may indicate absence of an indicator finish 11.

The strand 22 of FIG. 2B has a thin indicator finish 11 applied to a surface of the strand 22. In the context of this document, a strand having an indicator finish 11 similar to strand 22 may be generally referred to as an "indicator strand." In the embodiment of FIG. 2B the strand 22 is shown as copper-covered steel, having a steel core 13 and copper sheath 12. The finish 11 is may be applied to the strand 22 using various techniques, but in some embodiments, the indicator finish 11 is bonded chemically to the sheath 12, such as by plating. Thus, the strand 22 of FIG. 2B comprises a permanently-bonded indicator finish 11 on a portion of its outer surface, a permanently-bonded conductive copper sheath 12 as a middle layer of the strand 22, and an inner steel core 13.

The indicator finish 11 may comprise one or more materials having a characteristic that changes observably when the strand is subjected to a current level that is above a fault threshold. The indicator finish 11 has a thickness, which may vary based on desired performance of the indicator finish 11. Exemplary measurements of thickness of finish 11 may range from approximately 0.4 to 2.1 microns or otherwise. In some embodiments, the thickness of the finish 11 can vary further, as desired.

In an embodiment, and as described further below with regard to FIGS. 6 and 7, instead of or in addition to strands comprising an indicator finish 11, a cable 25 may include one or more jacketed strands having a jacket which includes a bimetallic conductor having an ultra-violet (UV) light-resistant PVC plastic jacket 35. The jacket 35 may melt away when the jacketed strand is subjected to a fault exceeding a fault threshold. The fault threshold for jacket 35 (as with other components of the cable and the cable itself) may be based on a fault current rating for the grounding cable, which can be expressed in current per unit time (e.g., kA/s) or other measure of exposure of the jacket to current for a period of time. In this case, the function of the jacket 35 (and the fault threshold associated with the jacket me be selected) is to indicate any significant fault received on the line, such as a fault of approximately 5% or more of a full rating of the cable (e.g., a rating based on strand gage, cable gage, etc.), although other percentages are possible. In some embodiments, a fault threshold for jacket 35 may be approximately between 1% and 5% of the cable's full fault rating; in alternative embodiments, up to approximately 5%; in alternative embodiments, up to approximately 10%; in alternative embodiments, up to 15%. In some embodiments, up to approximately 80%. Note that the jacket 35 may undergo melting or other changes when exposed to lower a fault current for an extended period of time. Thus, a fault current value associated with the fault threshold may decrease as a length of time the jacket 35 and wire are exposed to the fault current. In addition, the jacket 35 may not melt in presence of a continuous current, but in presence of a short circuit value of as little as 5% (2 kA/0.5 seconds) or less of a cable's fault rating (40 kA/0.5 seconds) may melt the jacket 35. A fault above 80% (32 kA/0.5 seconds) of the cable fault rating (40 kA/0.5 seconds) will melt away the jacket 35 and cause oxidation and darkening of tin finish 11 in indicator strands.

One or more such jacketed strands may be used in place of or in addition to strands 22 having a finish 11 comprising a permanent tin plating, which may be tarnished to a black or darkened hue at approximately 80% of the full rating in some embodiments. In this regard, a user (e.g., lineman) can not only locate the path of a short circuit fault into the ground (e.g., by observing darkening of tinned finish 11 of strands 22 of the cable 25), but also identify a range of fault current to which the cable was exposed by visually identifying and noting a portion of the cable which has been damaged, a type of damage that has occurred (jacket melting, darkening of the tin finish, changing tone and color of a copper finish) and associating such damage with an expected range of fault current values known to cause such damage in the ground cable and its components. In this regard, a user can perform visual inspection of a wire and based on a comparison of visual damage to the wire and its components with known fault thresholds for the components, (jacket, strands, etc.) differentiate between a large fault carrying event (e.g., approximately 80% or more of a fault rating for the cable, in which darkening of tin finish 11 occurs) and a small fault carrying event (e.g., approximately 5% or more of a fault rating for the cable in which only partial or complete melting of plastic jacket 35 occurs, without significant darkening of finish 11).

The observable change can be various aspects depending one or more materials selected for use in finish 11, but in some embodiments, the finish may undergo a state change, color change, change in luster or other observable change when strand is subjected to current that is above the fault threshold. In some embodiments, the indicator finish 11 comprises tin and has a metallic "gunmetal" appearance, but various other materials or combinations of materials may be used in other embodiments.

When the finish 11 comprises tin, the finish 11 may change color from gunmetal to a blackened color in the event of a short circuit (e.g., the current level exceeds the short circuit threshold current level). The finish 11 may undergo a state change, such as from solid to gas (e.g., sublimation) when a current above the fault threshold current is applied to the strand. In some embodiments, partial or complete sublimation of the indicator finish 11 may occur. This is shown and described further below with regard to FIGS. 5A and 5B.

In this regard, both exposure to short circuit events and fault events may be detected by visual inspection, as determined by whether the observable change in the finish 11 includes one or more of a change in color of the finish 11 or partial or complete sublimation of the finish 11. In this regard, the finish 11 facilitates not only identification of a ground cable that has reached the end of its service life (e.g., that finish 11 has undergone sublimation, leaving underlying strand material exposed following exposure of the strand to current levels above the fault threshold), but provides an indicator of health of the wire (e.g., that a color of the finish 11 has changed observably following exposure to current levels above the fault threshold). The finish 11 thus may indicate damage to a ground cable in a manner that permits an observable determination that the cable either is not in need of replacement, will be in need of replacement soon, or is in need of replacement now.

Example short circuit threshold current values for tin on a 0000 (4/0) American wire gauge (AWG) copper covered steel (CCS) conductor may be between approximately 15 and 20 kA per 0.5 s, or between approximately 38% and 50% of a standard current rating for a copper strand. Example fault threshold current values for tin finish on a 4/0 AWG CCS conductor may be approximately between 34 and 40 kA per 0.5 s, or between 85 and 100% of the standard current rating.

In some embodiments, aspects of the finish 11 and other aspects of a strand 22 (e.g., material composition, thickness, bonding method, core material, sheath material, etc.) can be selected to achieve a desired visual indication when the ground cable is exposed to a high current level. As an example, a material may be selected for use as finish 11 because its melting or phase change point corresponds to an amount of energy experienced when the cable 10 is exposed to a current level that exceeds a fault current threshold for which detection is desired. As noted above, if the ground cable 10 experiences current that exceeds a level above the fault threshold, the strands of the cable become heated beyond the melting or phase change point for the finish 11 material, and characteristics of the finish 11 change (e.g., the finish 11 changes from solid to liquid, solid to gas, or other change). Various other aspects of the finish 11 may be altered to achieve the functionality described herein in other embodiments. It will be understood that additional aspects of the finish 11 may be modified or altered to achieve a desired indication when the ground cable 10 is exposed to a selected fault current.

As an additional illustration of some embodiments of the present disclosure, the finish 11 may be applied to a copper-covered or copper-clad steel conductor, such as cable 25. In an embodiment, the cable 25 may comprise approximately 61 strands of approximately 0.0720-inch diameter engineered wire strands. A example resulting nominal thickness of the copper sheath 12 may be approximately 9% of the diameter of the wire strands, per ASTM B910-B9010M-07 (Reapproved 2013), Std. Spec for Annealed Copper-clad Steel. As a result, the cable 25 may have an overall diameter of 0.648 inch. An exemplary approximate fusing limit for the cable 25 may be approximately at 0.5 seconds of 43,000 amps (43 kA), and an approximate maximum tensile break load may be approximately 14,000 pound-force (14,000 lbs-force). In comparison, a stranded copper grounding conductor made of 19 strands of 0.1060 inch-diameter solid copper strands may have an overall diameter of 0.528 inch, a fusing limit at 0.5 seconds of 42,000 amps (42 kA), and a maximum tensile break load of approximately 6,000 pound-force (6,000 lbs-force). In addition, a failure mode of stranded copper grounding conductor carrying approximately 42 kA for 0.5 seconds comprises a dangerous and instantaneous vaporization of the conductor by explosion and resulting pressure wave. As a result, there may be little to no indication that a wire was ever present following exposure to the 42 kA current for approximately 0.5 s.

Figure 3:
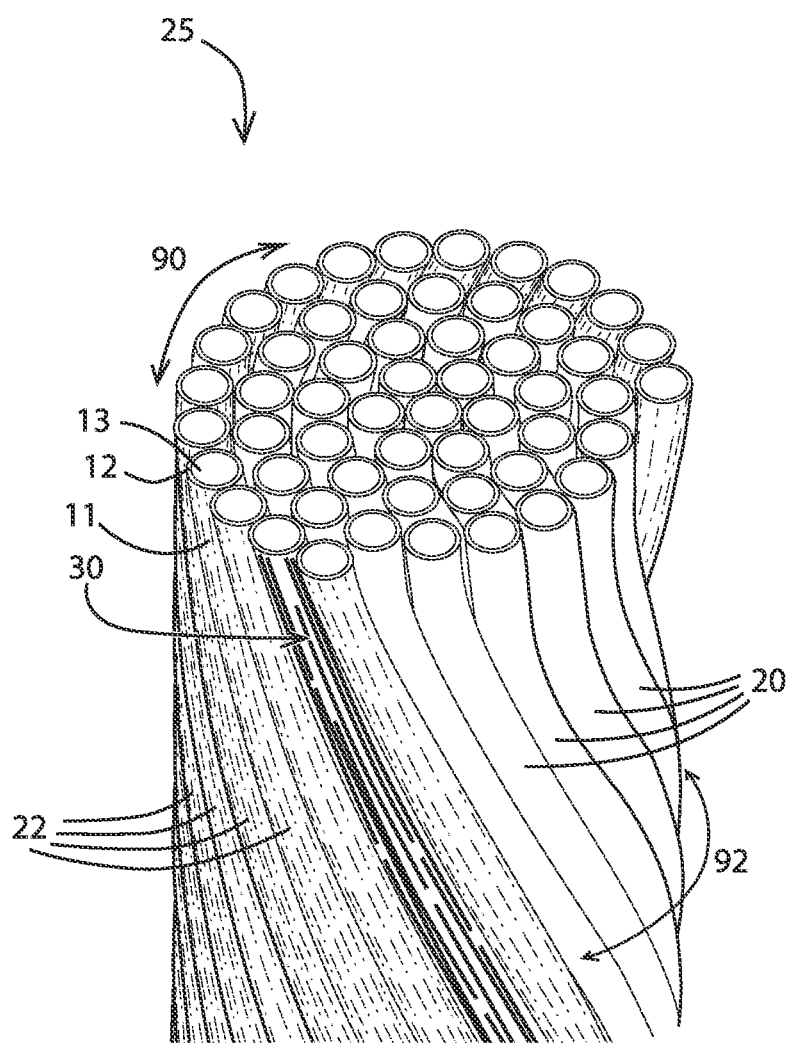
FIG. 3 shows a cross-sectional perspective view of a ground cable with an indicator finish in accordance with some embodiments of the present disclosure.
Figure 4:
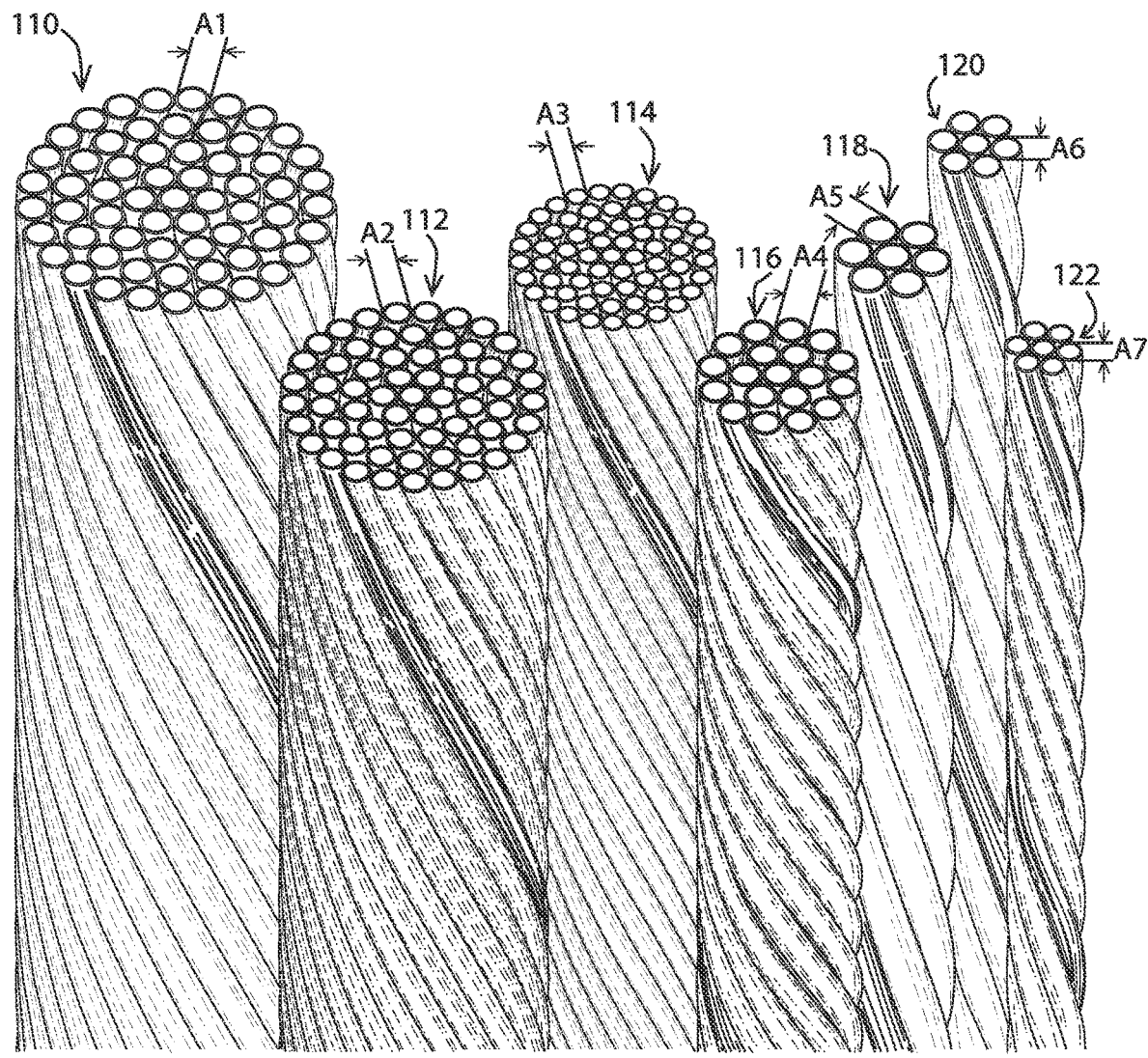
FIG. 4 shows a cross-sectional perspective view of ground cables with an indicator finish in accordance with some embodiments of the present disclosure.

FIG. 3 and FIG. 4 show cross-sectional perspective views of ground cables with an indicator finish in accordance with some embodiments of the present disclosure. The cable 25 of FIG. 3 has a plurality of inner core strands 92 configured similarly to the strands shown by FIG. 1. The core strands 92 shown in FIG. 3 are configured similarly to the bimetallic strand 20 shown by FIG. 2A, which comprises a core 13 and sheath 12 without an indicator finish 11. The core strands 92 are positioned adjacent a surrounding outermost layer or wrap of outer wrap strands 90. The outer wrap strands 90 shown in FIG. 3 are configured similarly to the indicator strand 22 shown by FIG. 2B, which comprises a core 13, sheath 12 and has an indicator finish 11. In some embodiments, the outer wrap strands 90 of cable 25 may comprise varying numbers of indicator strands 22, but in some embodiments, cable 25 comprises at least one indicator strand 22. The cable 25 of FIG. 3 is configured to have approximately 61 strands (24 outer wrap strands 90 and 37 inner strands 92), but other numbers of outer wrap strands and inner core strands are possible in other embodiments, such as in FIG. 4.

Ordinarily, the outer wrap strands 90 form an essentially continuous outer layer of the cable 25 (such as the embodiments shown in FIG. 4), but in FIG. 3, several of outer strands 90 have been removed to better show inner core strands 92. Note also that reference numbers 90 and 92 shall be understood as referring to each instance of the strands 92 and outer wrap stands 90 shown in FIG. 3, even though distinct reference lines are not shown extending from each of reference numbers 90 and 92 to the various inner core strands 92 and outer wrap stands 90 shown in FIG. 3.

In addition, the ground cable 25 of FIG. 3 comprises a reference strand 30. The reference strand 30 allows visual identification of the ground cable 25 as being of a type with indicator strands 22. The reference strand 30 may be fabricated from a material capable of surviving a fault current with little or no changes in its characteristics. In this regard, characteristics of the reference strand 30 may be visually compared with characteristics of other strands of the cable 25 when attempting to determine whether a fault has occurred. For example, if a cable 25 with a reference strand 30 also has a surface with a color other than the expected color of a finish of an indicator strand 22, it can be determined that the ground cable 25 likely has experienced a high current (e.g., above the short circuit threshold current). If desired, one or more indicator strands 30 may be used in order to achieve a desired look of the cable 25 (such as when it is desirable to conceal a true composition or nature of the wire 25, such as from copper thieves). Other benefits of the reference strand 30 may be apparent upon a reading of this disclosure.

As noted previously, ground cable 25 and its components may be designed and fabricated to exhibit changes in characteristics at one or more desired, specific and predetermined electric current levels. An additional benefit of some embodiments of the present disclosure is that electrical performance characteristics of ground cable 10 may approximately correspond to that of a grounding cable comprised of solid copper strands. Use of strands with copper sheaths coupled to cores made from materials stronger than copper allows for achievement of comparable electrical performance while simultaneously achieving a reduction in cable strand diameter, variations in strand count, and other improvements.

In this regard, a ground cable 10 fabricated according to some embodiments of the present disclosure may have various (e.g., graduated) cable diameters, but still maintain key performance aspects, such as current-carrying capability. Examples of graduated diameters are shown in FIG. 4, which depicts exemplary ground cables with varying thicknesses. The cables 110, 112, 114, 116, 118, 120 and 122 in FIG. 4 are shown having substantially similar characteristics and features to the cable 25 shown in FIG. 3, and are illustrated to provide examples of the varying strand and cable diameters, dimensions and thicknesses, as well as how numbers, size and arrangements of strands may vary as desired by cable (e.g., inner core strands 92 and outer wrap strands 90). Such variations may be identified and implemented for a particular application in order to allow the ground cable to survive higher short-circuit events than alternative solutions. And, the same engineered ground cable may be sized and constructed not to change state until the cable carries such a current that exceeds a fault threshold for the cable 10. Thus, the cable may receive a plurality of short-circuit currents (above the short circuit threshold current but below the failure threshold for that cable) over many years in the service of grounding protection without sacrificing a performance rating of the cable 10. As noted previously, essentially any aspect of the ground cables may be varied as desired in some embodiments of the present disclosure.

In some embodiments, a size (e.g., diameter, thickness, etc.) of a grounding cable and its respective strands may be selected based on a desired performance and properties, in which case, no indicator finish 11 is needed in order to indicate a fault. In some embodiments, this may be a standard gauge size, although in some embodiments, such sizing may be different from standard gauge sizing, such as between gauge sizes. For example, a grounding cable size may be selected that will allow a grounding cable as described herein (e.g., having a steel core 13 and copper sheath 12) to achieve comparable electrical performance and properties to an all-copper grounding cable. Exemplary standardized measurements and attributes for CCS (e.g., nominal conductivity, density, resistivity at 20° C., tensile strength, thickness, etc.) may be found in American Society for Testing Materials (ASTM) standard B910/B910M (2013 Revision), which is incorporated herein by reference. As noted above, sizing for the strands may be selected that is between standard AWG and ASTM sizing, and so attributes may vary based on such selection. In some embodiments, a thickness for the sheath 12 may be between approximately 5% and 9% of the diameter of the strand 22. However, in some embodiments, sheath 12 may have a thickness that is less than approximately 1% of the diameter of strand 22 (e.g., as little as one micron). Other thicknesses/diameters of the strand 22, of copper sheath 12 and core 13 may be possible to achieve the functionality described herein.

Figure 5A:
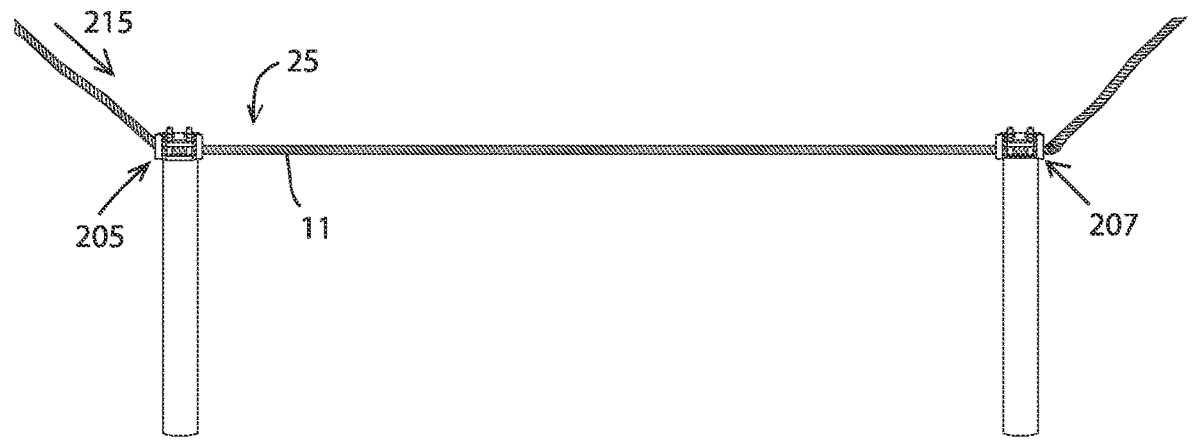
FIG. 5A shows view of a ground cable with an indicator finish before exposure to current that exceeds a fault threshold of the ground cable in accordance with some embodiments of the present disclosure.
Figure 5B:
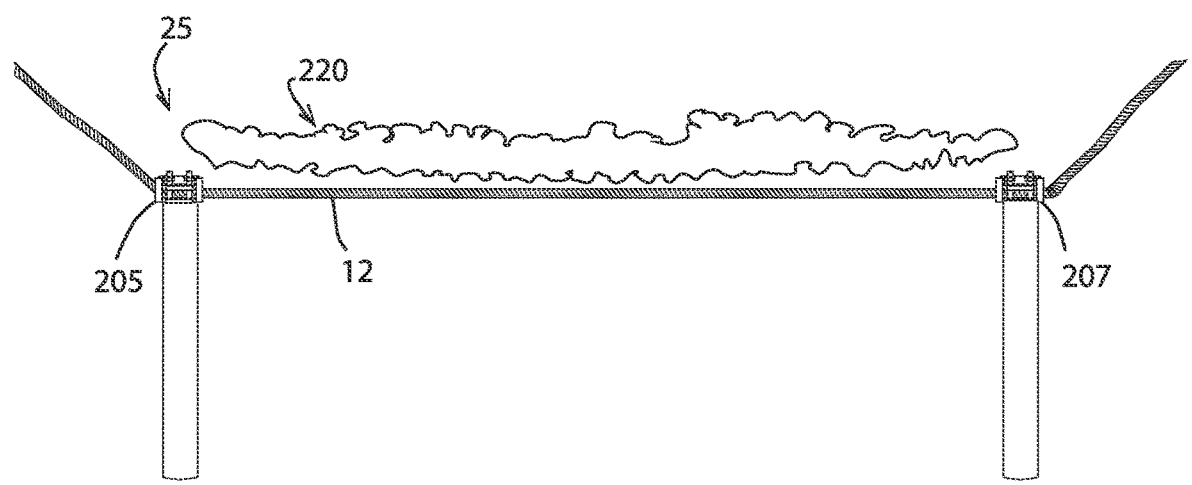
FIG. 5B shows view of a ground cable with an indicator finish after exposure to current that exceeds a fault threshold of the ground cable in accordance with some embodiments of the present disclosure.

In addition, and as explained further with regard to FIGS. 5A and 5B, a cable having a steel core 13 and copper sheath 12 may undergo physical changes and visible damage if exposed to a ground fault, even in absence of an indicator finish 11. It has been observed that a cable 25 may be able to withstand two fully-rated short circuit events exceeding a fault threshold for the cable (e.g., at approximately 80% of the rating for the cable) without failing. A first short circuit event may produce a visible color change in the sheath 12, while a second may cause failure of the cable 25. Using such changes as indication of extent of and location of a fault having been carried to ground at a percentage of the fault rating exceeding the fault threshold may allow service, repair or replacement of the cable before a subsequent fault occurs, resulting in failure and breaking the conductive path to ground. Early identification of fault occurrence and location greatly enhances integrity of the cable, grid and grounding system, and dramatically improves personnel safety.

Determining remaining service life of a grounding cable based on such physical changes is a novel and non-obvious approach to assessing a service life of a grounding cable and identifying cables whose service life has ended and are in need of replacement.

In this regard, a strand size (e.g., diameter) of strands of a grounding cable may be selected based on desired electrical performance but also that will show visible change (e.g., damage) when exposed to a ground fault (e.g., that meets or exceeds a fault threshold), thereby allowing detection of ground faults even with out addition of finish 11 (e.g., when a strand has no indicator finish 11, such as depicted in FIG. 2A). Each of a diameter of the strand, diameter of steel core 13, and thickness of copper sheath 12 may be determined, selected and varied as desired to achieve a desired performance and fault indication.

In some embodiments, a fault indication feature may be achievable on strand diameter sizes of up to approximately 0.10 inch, or roughly 10 American Wire Gauge ("AWG") strand size; alternatively, up to approximately 0.46 inch, or roughly 0000 AWG strand size. In some embodiments, one or more strands of a cable 25 may have a diameter this is approximately between two accepted AWG wire strand gauge sizes. Selection of strand size based on desired performance and fault indication may allow a ground cable according to some embodiments of the present disclosure to achieve performance and fault detection that is essentially equivalent to copper where previous products failed, because such products prioritized use of standard gauge sizes over sizing for performance and functionality of a cable such as described herein.

As an illustration, turning briefly to FIG. 4, the various cables depicted may have average strand diameters that are between standard gauge sizes, and that permit fault detection even in absence of indicator finish 11 (which is depicted on strands of the respective cables in FIG. 4, but may be absent from such in some embodiments).

In an embodiment, the cables 110-122 of FIG. 4 may be produced without an indicator finish 11, and may have one or more strands sized (e.g., having a gauge size or diameter selected) to achieve desired electrical performance and fault indication. Cable 110 may have a strand size A1 that is approximately 0.1043 inches in strand diameter (61 strands, approximately 0.94 in. overall cable diameter) with an indicator finish 11 or bare, and achieves resistance (ohms/1000 ft) of approximately 0.040; in an embodiment, cable 112 may have a strand size A2 that is 0.0.0890 inches in strand diameter (61 strands, approximately 0.79 in. overall cable diameter) with an indicator finish 11 or bare, and achieves resistance (ohms/1000 ft) of approximately 0.057; in an embodiment, cable 114 may have a strand size A3 that is approximately 0.0695 inches in strand diameter (61 strands, approximately 0.62 in. overall cable diameter) with an indicator finish 11 or bare, and achieves resistance (ohms/1000 ft) of approximately 0.093; in an embodiment, cable 116 may have a strand size A4 that is approximately 0.0985 inches in strand diameter (19 strands, approximately 0.48 in. overall cable diameter) with an indicator finish 11 or bare, and achieves resistance (ohms/1000 ft) of approximately 0.148; in an embodiment, cable 118 may have a strand size A5 that is approximately 0.1117 inches in strand diameter (7 strands, approximately 0.33 in. overall cable diameter) with an indicator finish 11 or bare, and achieves resistance (ohms/1000 ft) of approximately 0.303; in an embodiment, cable 120 may have a strand size A6 that is approximately 0.0887 inches in strand diameter (7 strands, approximately 0.26 in. overall cable diameter) with an indicator finish 11 or bare, and achieves resistance (ohms/1000 ft) of approximately 0.475; and in an embodiment, cable 122 may have a strand size A7 that is approximately 0.0701 inches in strand diameter (7 strands, approximately 0.21 in. overall cable diameter) with an indicator finish 11 or bare, and achieves resistance (ohms/1000 ft) of approximately 0.762. Other sizes and diameters are possible in FIG. 5A shows view of a ground cable with an indicator finish before exposure to current that exceeds a fault threshold, and FIG. 5B shows view of a ground cable with an indicator finish after exposure to current that exceeds a fault threshold of the ground cable, in accordance with some embodiments of the present disclosure. Bronze connectors 205, 207 are positioned on first and second ends of cable 25, which is configured to carry a fault current 215 during a fault event. In practice, a protective circuit may comprise bronze connectors similar to the bronze connectors 205, 207 of FIG. 5A and FIG. 5B, although the connectors may be made from other materials in other embodiments. In some embodiments, yet other connection techniques may be used to connect ground cable 25 to a protective circuit, including mechanical, exothermically welded, high pressure crimped installation methods, or otherwise.

As an example of the functionality noted above, during a fault event, a current above the fault threshold current for the cable 25, such as current 215, may be introduced to cable 25. The excess energy from current 215 may cause sublimation of finish 11, producing vapor 220. The vapor 220 may remove the tin finish 11 and reveal a surface of copper sheath 12. Vapor 220 may comprise both copper from copper sheath 12 and tin from the indicator finish 11. The resulting removal of solid material from the ground cable 25 in the vapor 220 alters the surface of the ground cable 25 permanently. In this regard, removal of tin and copper from the cable 25 may allow for a determination that the cable 25 has experienced a fault event using visual inspection, such as by comparing an expected state of the cable 25 under normal circumstances—with its tin finish 11 present—with an actual state of the cable 25 in which the finish 11 has been removed.

FIG. 6 shows view of a ground cable 25 with a jacketed reference strand 33 and FIG. 7 shows an alternative telescoped view of the ground cable 25 with jacketed reference strand 33 in accordance with some embodiments of the present disclosure. The ground cable 25 of FIGS. 6 and 7 includes one or more jacketed reference strands 33. In an embodiment, the jacketed reference strand 33 may have similar features to strands 22 or 30 of FIGS. 3 and 4, except that strand 33 has a jacket 35 as its outermost layer. In some embodiments, the strand 33 may have a steel core 13 and copper sheath 12, although in some embodiments, strand 33 may comprise one or more other materials as described above with regard to strands 22 and 30.

Each of the one or more strands 33 has an outermost layer ("jacket") 35 that completely or partially forms an outermost surface of the one or more strands 33. In some embodiments, the jacket 35 comprises a substance that will partially or completely melt away from an underlying, adjacent layer of strand 33 (e.g., a copper sheath 12 of the strand 33) in the event of a fault that exceeds a fault threshold for the jacketed reference strand 33. In this regard, a user may visually identify faults at the ground cable 25 by observing changes to the strand 33, specifically, that the outermost jacket 35 is completely or partially melted away when exposed to a fault that exceeds the fault threshold, thereby exposing the underlying adjacent layer (e.g., copper sheath 12).

Example fault threshold current values for jacket 35 on a 4/0 AWG CCS conductor may be approximately between 34 and 40 kA per 0.5 s, or between 85 and 100% of the standard current rating. A desired fault threshold for the jacket 35 may be achieved by selecting one or more materials for and treatment of (e.g., heating, etc.) of the jacket 35 having properties that will cause the jacket 35 to change condition to when exposed to current meeting or exceeding the desired fault threshold. Other techniques for selecting one or more materials for jacket 35 may be used in order to achieve a jacket 35 that visually indicates desired ground fault occurrences in some embodiments.

Note that a current associated with a fault threshold at which the jacket 35 completely or partially melts may be lower than a current associated with a fault threshold (e.g., 5% of fault rating) at which darkening of finish 11 occurs (e.g., 80% of fault rating; at 100% of the fault rating, the wire may fail or explode). In this regard, use of a jacketed reference strand 33 with jacket 35 and a strand 22 having an indicator finish 11 may enable a user (e.g., lineman) to distinguish between types of fault events by noting whether damage is visible at the jacketed reference strand 33, strand 22 with indicator finish 11, or both. As an example, if the user notes that darkening of finish 11 of one or more strands of the cable 25 has occurred, the user may note that a large fault event (or a fault event approaching a fault threshold for strands 22 having an indicator finish 11) has occurred, and take appropriate action such as repairing or replacing the cable 25. Alternatively, if the user notes that the jacket 35 has completely or partially melted, but that little or no darkening of finish 11 of one or more strands 22 has occurred, the user may note that a fault event meeting or exceeding the fault threshold for the jacketed reference strand 33 has occurred, but that such fault did not exceed the fault threshold for the strands 22 with indicator finish 11. In this regard, the user may note such damage to the jacketed strand 33 and mark it for repair or replacement, or adjust a determination of remaining service life for the cable 25 based on the observed damage. Other determinations may be made based on changes to characteristics of the cable 25 in other embodiments.

As noted above, one or more such jacketed strands 33 may be used in place of or in addition to strands 22 having a finish 11 comprising a permanent tin plating, which may be tarnished to a black or darkened hue at a fault threshold for the strand with finish 11, which may be approximately 85% of the full rating of the cable 25 in some embodiments. In this regard, a user (e.g., lineman) can not only locate the path of a short circuit fault into the ground (e.g., by observing darkening of tinned finish 11 of strands 22 of the cable 25), but also differentiate between a large fault carrying event (in which darkening of tin finish 11 occurs) and a small fault carrying event (in which only partial or complete melting of plastic jacket 35 occurs, without significant darkening of finish 11).

The embodiments of cable 25 shown in FIGS. 6 and 7 are similar to the embodiment of cable 25 shown in FIGS. 3 and 4. However, instead of including a reference strand 30 adjacent to strands 22 having indicator finish 11, as in FIGS. 3 and 4, the embodiments of cable 25 in FIGS. 6 and 7 include a jacketed reference strand 33 adjacent to strands 22 having indicator finish 11. In this regard, the strands 22 have a tinned appearance, while the jacketed reference strand has an appearance based on one or more materials selected for use in jacket 35. In some embodiments, a cable 25 may include one or more of both a reference strand 30 and jacketed reference strand 33.

In some embodiments, the jacket 35 comprises a polymer, although other types of materials and substances are possible. Example polymers, which may be used alone or in combination with one another and with other substances to form jacket 35 in some embodiments may include: polyvinyl chloride (CAS No. 9002-86-2); polyethylene (CAS No. 9002-88-4); polyethylene homopolymers and copolymers, polypropylene (CAS No. 9003-07-0), polypropylene homopolymers and copolymers, functionalized polyolefins (CAS No. 89-25-8), polyesters (CAS No. 113669-97-9), poly(ester-ether) (CAS No. 25104-37-4), polyamides (e.g., CAS No. 63428-84-2), including nylons (e.g., CAS No. 25038-54-4), poly(ether-amide), polyether sulfones (CAS No. 25667-42-9), fluoropolymers (CAS No. 9002-84-0), polyurethanes (CAS No. 9009-54-5), and mixtures thereof. In some embodiments, a conductive polymer may be used, such as a polymer which comprises carbon. The polymer may comprise a structural polymer fraction and plasticizer polymer fraction, each of which may comprise one or more suitable substances described herein.

In some embodiments, the jacket 35 may have a desired exterior color, such as green or other color for easy identification by a user. In some embodiments, the jacket 35 may have an exterior color, pattern or combination thereof selected based on one or more applicable standards, regulations, or schemes. The jacket 35 may have one or more additional colors, patterns, or combinations of such in other embodiments, as may be required or desired.

In some embodiments, the jacket 35 be made from one or more other materials to achieve the functionality of reference jacket 35 described herein (e.g., indicating a fault at the wire 25 by separating or removing from an underlying surface of the strand 33 in the event of a fault).

In some embodiments, the jacket 35 may be a PVC jacket having a 10 mil thickness (radially toward a central axis of the strand 33). In some embodiments, jacket 35 may have a thickness of preferably about 10 mils (0.001 inches). Alternatively, the jacket 35 may have a thickness of between approximately 5 mils and approximately 40 mils; alternatively, between approximately 10 mils and 110 mils, although other thicknesses are possible in other embodiments.

In some embodiments, a thickness of the jacket 35 may be based on a selected performance (e.g., electrical properties) of one or more of the jacket 35, copper sheath 12 and steel core 13 of a strand 33. As an example, a thickness of the jacket 35 may be selected based on a diameter of steel core 13 and copper sheath 12 associated with a desired electrical performance of the strand 33 and the cable 25.

Alternatively, jacket 35 may have a thickness selected based on desired performance of the jacket 35 during a fault event. For example, a thickness of jacket 35 may be selected based on changes to the jacket 35 that occur at a fault current or voltage for which detection is desired (e.g., based on a safety factor, such that service life may end before failure of the cable 25 occurs). Physical characteristics of the jacket 35 may be changed in the event of a fault in some embodiments. For example, when the jacket 35 experiences a fault current of greater than approximately 5% of the fault rating for cable 25 (e.g., approximately 41 kA for 0.5 seconds or other rating, all or part of the jacket may melt, change color, or otherwise show damage and change in physical characteristics, such as color, shape, state (e.g., solid to liquid, sublimation, etc) or otherwise. In some instances, where fault current is not sufficient to completely melt the jacket 35, one or more physical characteristics of the jacket 35 and jacketed reference strand 33 nevertheless may change in a manner that indicates remaining service life of the strand 33 and cable 25.

Note that in some embodiments, a diameter of strand 33 may be a diameter associated desired gage (e.g., having a diameter "A" in FIG. 6) for strands of the cable 25. In this regard, the strand diameter "A" may be approximately the same as other strands 22 of the cable 25 (also having a diameter "A" in FIG. 6). In some embodiments, a diameter of a portion of strand 33 without the jacket 35 may be reduced to accommodate addition of the jacket 35. In this regard, a diameter of the strand 33 without the jacket (e.g., diameter "B") may be a diameter of the steel core 13 plus twice a thickness sheath 12. Thus, a diameter of steel core 13 and thickness of copper sheath 12 in a jacketed reference strand 33 may be reduced as compared diameters of corresponding steel core 13 and sheath 12 in a typical strand 22 to accommodate for a thickness of jacket 35.

In the telescoped view of FIG. 7, the strand 25 comprises an outer layer 90, first core layer 92 positioned adjacent to and inside of the outer layer 90, second core layer 94 positioned adjacent to and inside of the first core layer 92, and third core layer 96 positioned adjacent to and inside of the second core layer 94. The outer layer 90 comprises strands 22 with a tinned finish 11 and a jacketed reference strand 33. Each layer 92-96 comprises essentially identical strands 22, each of which may or may not have a tinned finish 11. In the embodiment of FIG. 7, a direction of twist about the Y-axis of strands 22 of each successive layer 90-96 alternates, but other orientations are possible in other embodiments. A direction of twist of strands of the various of the layers 90-96 may vary as desired to achieve desired characteristics of the cable 25 in some embodiment. In an embodiment, a ground cable may comprise a core strand and an indicator strand positioned adjacent to the core strand, wherein an observable change in a characteristic of the indicator strand occurs when a current carried by the ground cable exceeds a fault threshold. In an embodiment of the ground cable, the indicator strand comprises an indicator finish. In an embodiment of the ground cable, the observable change comprises sublimation of a portion of the indicator finish. In an embodiment of the ground cable, the indicator finish may comprise a metal. In an embodiment, the metal comprises tin.

In an embodiment of the ground cable, a copper sheath is positioned adjacent to a surface of the core strand. In an embodiment of the ground cable, the characteristic comprises a color of the indicator strand. In an embodiment of the ground cable, the fault threshold is less than a failure threshold of the ground cable.

In an embodiment, a method for detecting faults in a ground cable, comprises providing a core strand and positioning an indicator strand adjacent to the core strand, wherein an observable change in a characteristic of the indicator strand occurs when a current carried by the ground cable exceeds a fault threshold.

The method further comprises wherein the indicator strand comprises an indicator finish. The method further comprises wherein the observable change comprises sublimation of a portion of the indicator finish. The method further comprises wherein the indicator finish comprises a metal. The method further comprises wherein the metal is tin. The method further comprises wherein a copper sheath is positioned adjacent to a surface of the core strand. The method further comprises wherein the characteristic comprises a color of the indicator strand. The method further comprises wherein the fault threshold is less than a failure threshold of the ground cable.

The foregoing description illustrates and describes the processes, machines, manufactures, compositions of matter, and other teachings of the present disclosure. Additionally, the disclosure shows and describes only certain embodiments of the processes, machines, manufactures, compositions of matter, and other teachings disclosed, but, as mentioned above, it is to be understood that the teachings of the present disclosure are capable of use in various other combinations, modifications, and environments and is capable of changes or modifications within the scope of the teachings as expressed herein, commensurate with the skill and/or knowledge of a person having ordinary skill in the relevant art. The embodiments described hereinabove are further intended to explain certain best modes known of practicing the processes, machines, manufactures, compositions of matter, and other teachings of the present disclosure and to enable others skilled in the art to utilize the teachings of the present disclosure in such, or other, embodiments and with the various modifications required by the particular applications or uses. Accordingly, the processes, machines, manufactures, compositions of matter, and other teachings of the present disclosure are not intended to limit the exact embodiments and examples disclosed herein. Any section headings herein are provided only for consistency with the suggestions of 37 C.F.R. § 1.77 or otherwise to provide organizational queues. These headings shall not limit or characterize the invention(s) set forth herein.

What is claimed is:

1. A ground cable for use in a power distribution network, comprising:
    a core strand;
    an indicator strand positioned adjacent to the core strand, wherein an observable change in a characteristic of the indicator strand occurs when a current carried by the ground cable exceeds a fault threshold; and
    a jacketed strand positioned adjacent to the core strand, wherein the jacketed strand comprises a jacket disposed around a core of the jacketed strand, wherein a portion of the jacket is visible to a user observing the ground cable, and wherein the portion of the jacket undergoes at least a partial melting when the current carried by the ground cable exceeds the fault threshold, and wherein the jacketed strand comprises at least one conductive layer positioned between a core of the jacketed strand and the jacket of the jacketed strand.

2. The ground cable of claim 1, wherein the indicator strand comprises an indicator finish and wherein an outermost surface area of the ground cable comprises a portion of an outermost surface of the jacketed strand.

3. The ground cable of claim 2, wherein the observable change comprises sublimation of a portion of the indicator finish.

4. The ground cable of claim 2, wherein the indicator finish comprises a metal.

5. The ground cable of claim 4, wherein the metal is tin.

6. The ground cable of claim 1, wherein a copper sheath is positioned adjacent to a surface of the core strand.

7. The ground cable of claim 1, wherein the characteristic comprises a color of the indicator strand.

8. The ground cable of claim 1, wherein the fault threshold is less than a failure threshold of the ground cable.

9. The ground cable of claim 1, wherein the jacket comprises a plastic material.

10. The ground cable of claim 1, wherein a diameter of the core of the jacketed strand is less than a diameter of a core of the indicator strand.

11. The ground cable of claim 1, wherein the jacket comprises an ultra-violet light resistant material.

12. The ground cable of claim 1, wherein the jacket has a material selected based on a desired melting point, and wherein the desired melting point is selected based on a desired percentage of a full fault current of the ground cable at which the jacket material will melt.

13. A method for detecting faults in a ground cable for use in a power distribution network, comprising:
    providing a core strand;
    positioning an indicator strand adjacent to the core strand, wherein an observable change in a characteristic of the indicator strand occurs when a current carried by the ground cable exceeds a fault threshold; and
    positioning a jacketed strand adjacent to the core strand, wherein the jacketed strand comprises a jacket disposed around a core of the jacketed strand, wherein a portion of the jacket is visible to a user observing the ground cable, and wherein the portion of the jacket undergoes at least a partial melting when the current carried by the ground cable exceeds the fault threshold, and wherein the jacketed strand comprises at least one conductive layer positioned between a core of the jacketed strand and the jacket of the jacketed strand.

14. The method of claim 13, wherein the indicator strand comprises an indicator finish and wherein an outermost surface area of the ground cable comprises a portion of an outermost surface of the jacketed strand.

15. The method of claim 14, wherein the observable change comprises sublimation of a portion of the indicator finish.

16. The method of claim 14, wherein the indicator finish comprises a metal.

17. The method of claim 16, wherein the metal is tin.

18. The method of claim 13, wherein a copper sheath is positioned adjacent to a surface of the core strand.

19. The method of claim 13, wherein the characteristic comprises a color of the indicator strand.

20. The method of claim 13, wherein the fault threshold is less than a failure threshold of the ground cable.

\* \* \* \* \*